United States Patent [19]

Temple

[11] Patent Number: 4,646,117
[45] Date of Patent: Feb. 24, 1987

[54] POWER SEMICONDUCTOR DEVICES WITH INCREASED TURN-OFF CURRENT RATINGS AND LIMITED CURRENT DENSITY IN PERIPHERAL PORTIONS

[75] Inventor: Victor A. K. Temple, Clifton Park, N.Y.

[73] Assignee: General Electric Company, Schenectady, N.Y.

[21] Appl. No.: 678,530

[22] Filed: Dec. 5, 1984

[51] Int. Cl.[4] ............................................. H01L 29/78
[52] U.S. Cl. ............................... 357/23.4; 357/23.14; 357/34; 357/38; 357/43; 357/86
[58] Field of Search .................... 357/20, 34, 38, 23.4, 357/86, 23.14, 43

[56] References Cited

U.S. PATENT DOCUMENTS

| | | | |
|---|---|---|---|
| 4,145,700 | 3/1979 | Jambotkar | 357/23.4 |
| 4,417,385 | 11/1983 | Temple | 357/86 |
| 4,443,810 | 4/1984 | Yatsuo et al. | 357/86 |
| 4,532,534 | 7/1985 | Ford et al. | 357/23.14 |
| 4,567,502 | 1/1986 | Nakagawa et al. | 357/23.4 |

OTHER PUBLICATIONS

B. J. Buliga et al., "The Insulated Gate Rectifier (IGR): A New Power Switching Device", IEDM 82 (Dec. 1982), pp. 264-267.

Primary Examiner—Joseph E. Clawson, Jr.
Attorney, Agent, or Firm—John R. Rafter; James C. Davis, Jr.; Marvin Snyder

[57] ABSTRACT

Power semiconductor devices having active regions of multicellular construction achieve increased turn-off current capacity through limitation of the on-state current density in peripheral cells of the active region. Devices that may benefit from the present invention include MOSTOTs, IGTs, GTOs, and bipolar transistors, by way of example.

20 Claims, 11 Drawing Figures

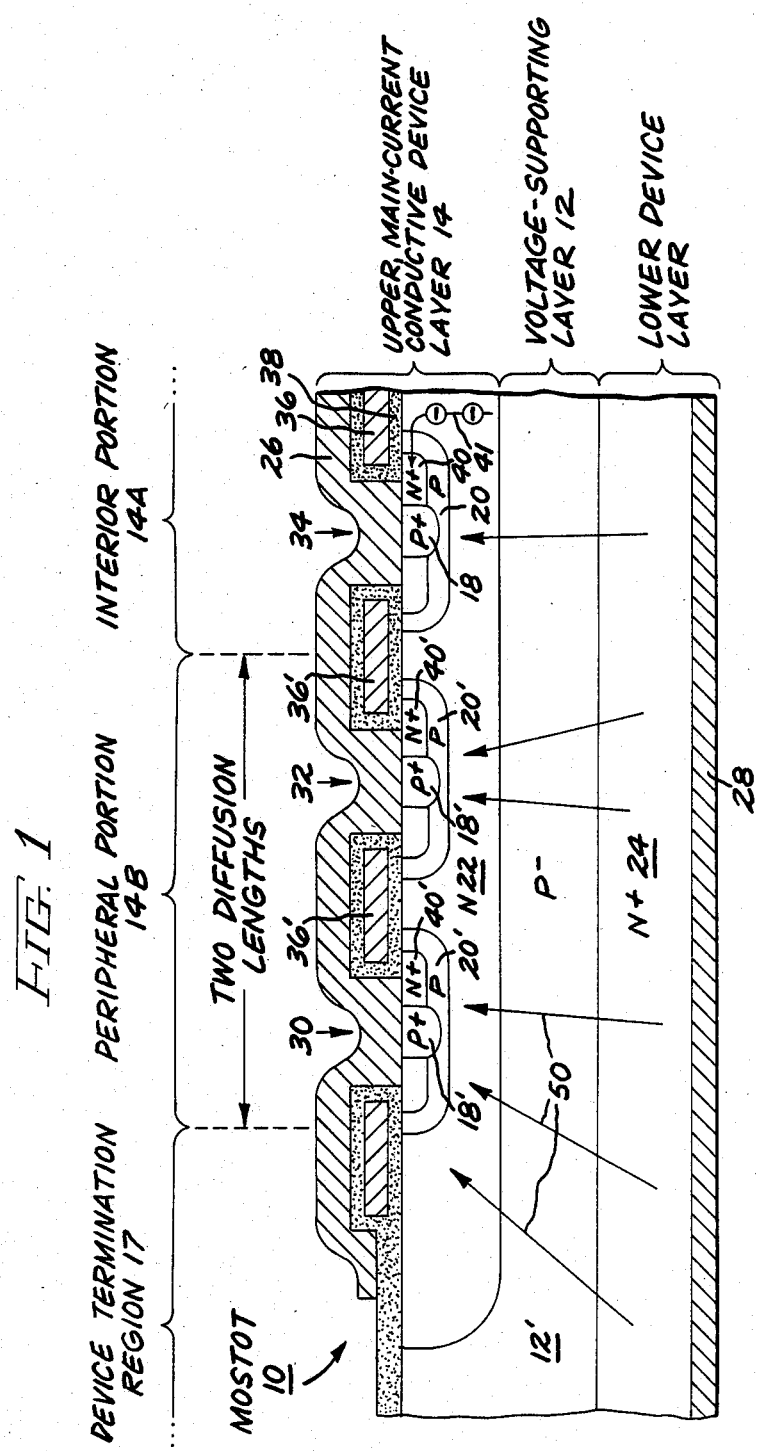

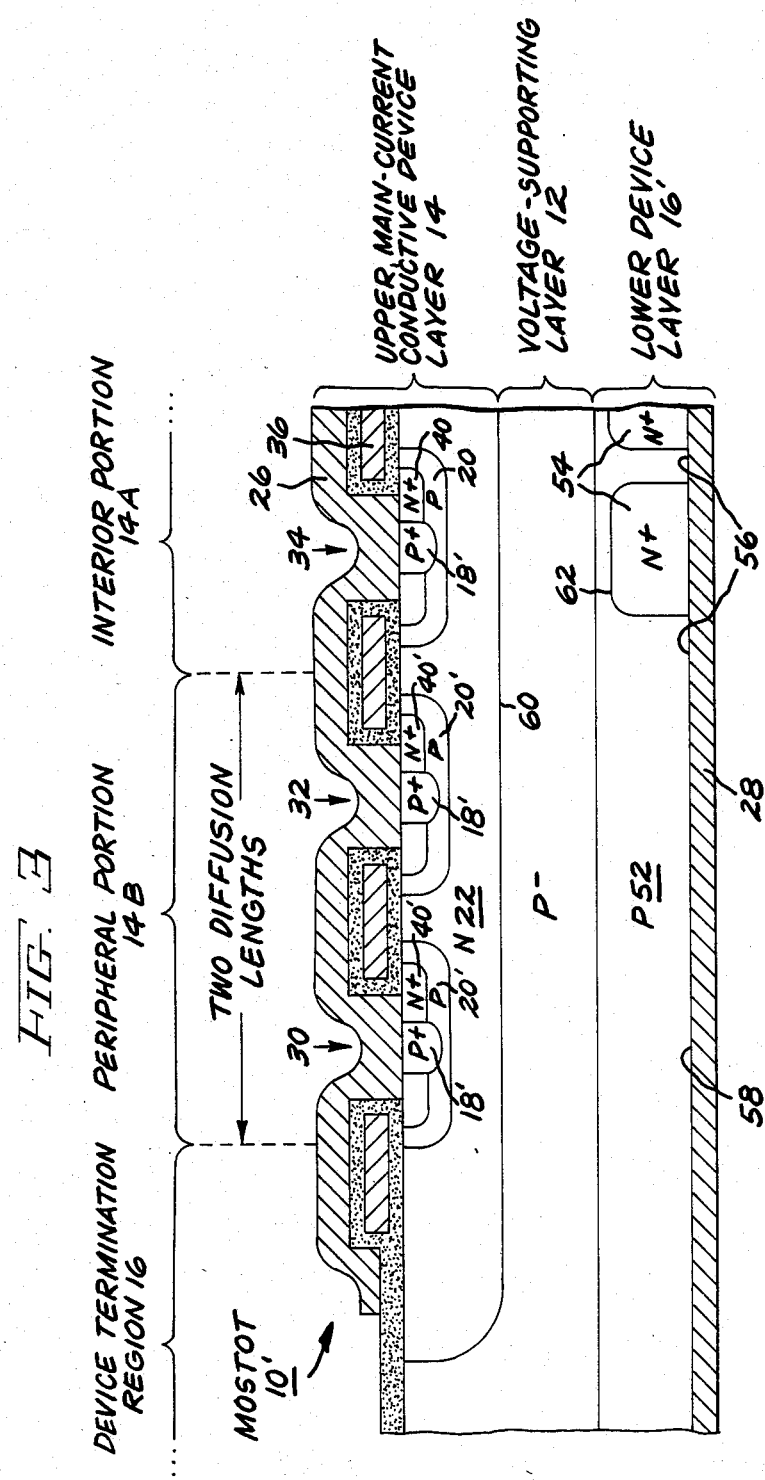

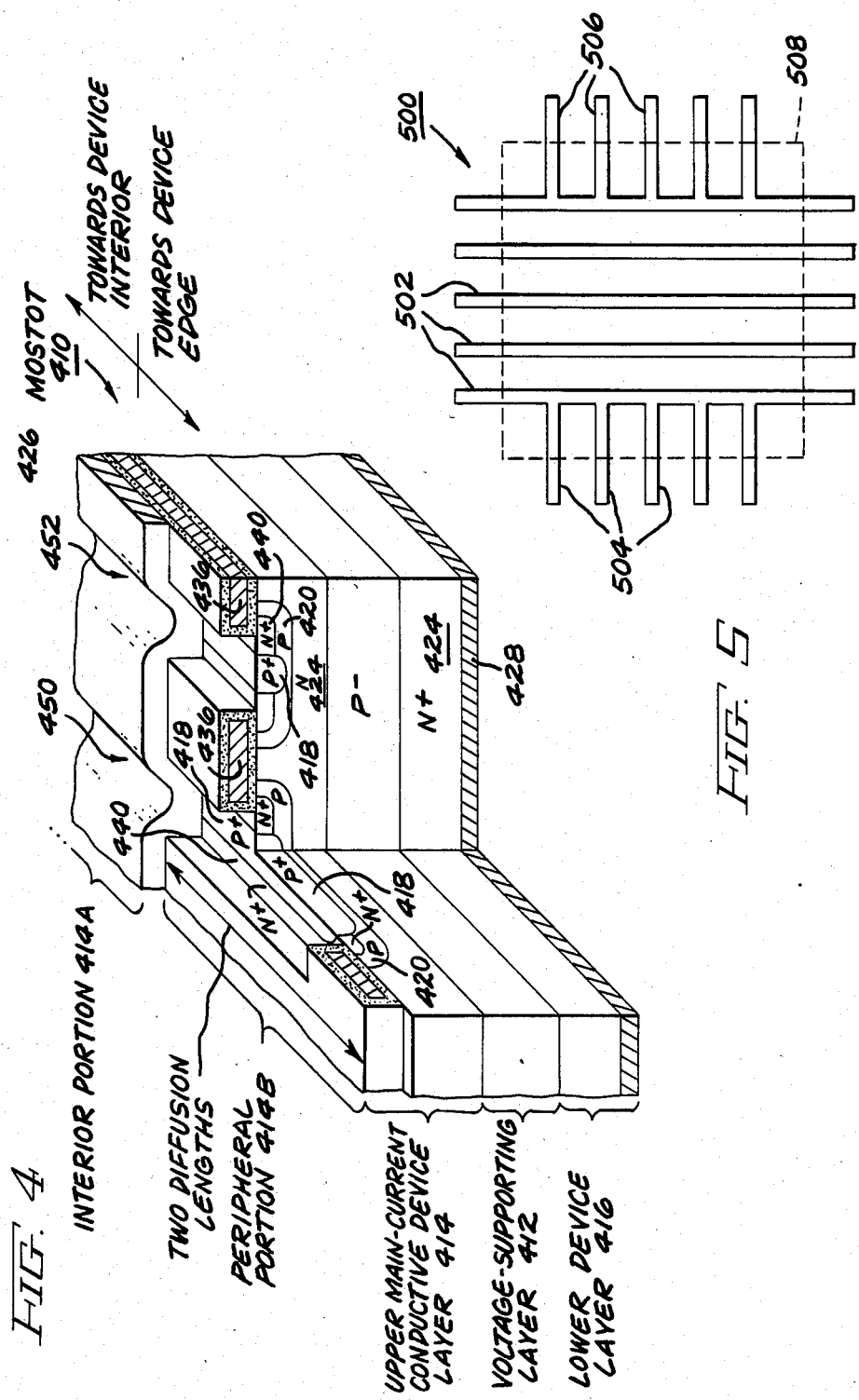

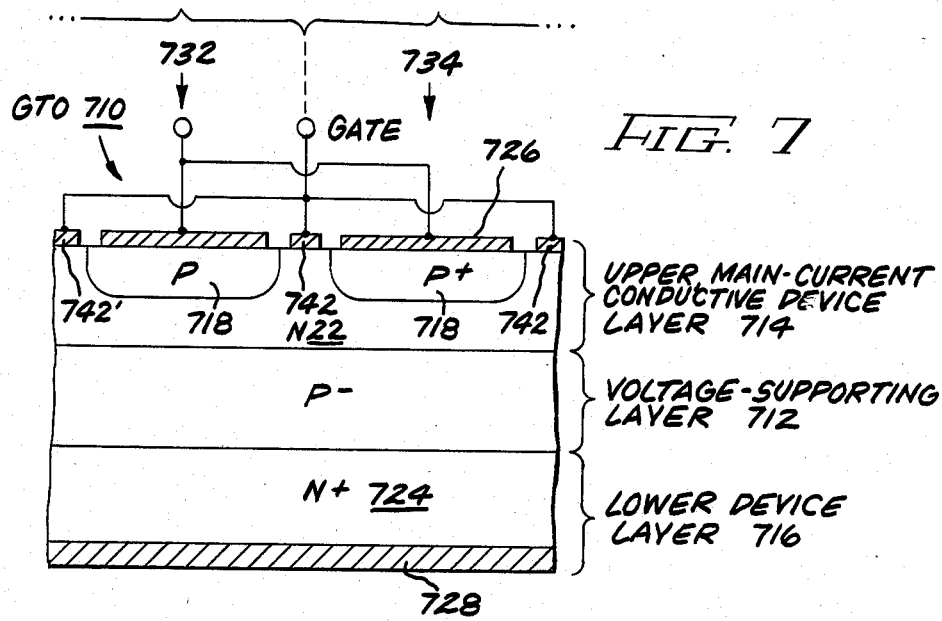
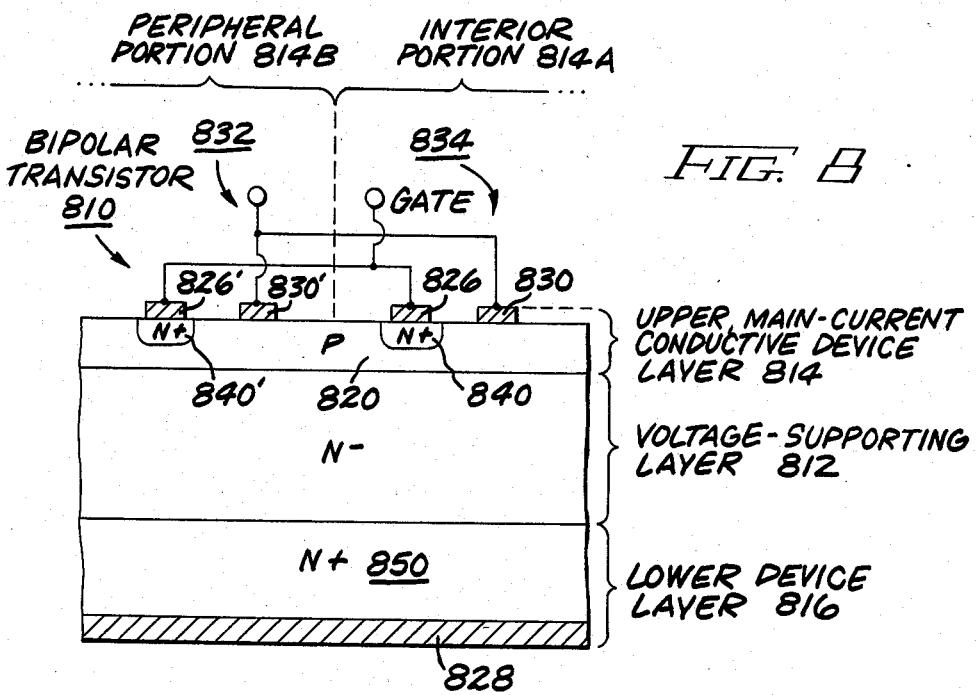

POWER SEMICONDUCTOR DEVICES WITH INCREASED TURN-OFF CURRENT RATINGS AND LIMITED CURRENT DENSITY IN PERIPHERAL PORTIONS

REFERENCE TO RELATED APPLICATION

Subject matter relevant to the instant application is disclosed and claimed in commonly assigned, copending application entitled "Method of Reducing the Current Gain of an Inherent Bipolar Transistor in an Insulated Gate Semiconductor Device and Resulting Devices", Ser. No. 640,280, now U.S. Pat. No. 4,620,211, filed on Aug. 13, 1984 by B. J. Baliga, T. P. Chow, and V. A. K. Temple (the applicant herein). The disclosure of this related application is specifically incorporated herein by reference.

BACKGROUND OF THE INVENTION

The present invention relates to power semiconductor devices with increased turn-off current ratings, and, more particularly, to such power devices that are multicellular in construction.

Metal-Oxide-Semiconductor Turn-Off Thyristors (MOSTOTs) are power thyristors that include MOS-type turn-off structure for removing current carriers from an inner base region of the device, and, accordingly, that have gate turn off capability. High current MOSTOTs are multicellular in construction; that is, the active, or current-conducting, region of such a MOSTOT is comprised of many cells, or repeated structures. A typical MOSTOT, of one square centimeter (active device area), contains several thousand cells.

Each cell of a typical multicellular MOSTOT contains substantially identical MOS-type turn-off structure capable of turning off the same current at the same density. Conventional fabrication procedures for MOSTOTs, however, result in the peripheral cells of the active region having a higher on-state current density than interior cells, due to the effect of current spreading in a voltage-supporting layer of the device that surrounds the peripheral cells.

To achieve turn-off of the MOSTOT requires that all the cells of the active region turn off at approximately the same time. Otherwise, device current tends to flow to a cell that has not turned off, due to the lower resistance path offered by such cell. Peripheral cells are typically in this category, due to their higher on-state current density, and, consequently, conduct current at an even higher current density after device turn-off is initiated. The peripheral cells may become overloaded in that they cannot turn off peripheral cell current, and, in such a case, gate turn-off of the MOSTOT is lost. As a remedial measure, the maximum turn-off current rating of the MOSTOT could be reduced. This, however, underutilizes the MOSTOT and requires more device area for a specified turn-off current rating. It would thus be desirable to provide a MOSTOT having an increased turn-off current rating.

Other types of power semiconductor devices have reduced turn-off current ratings due to peripheral cells of their active regions having a higher on-state current density than interior cells of the active regions. Such devices include insulated-gate transistors (IGTs), gate-turn off thyristors (GTOs), and bipolar transistors. It would be desirable to increase the turn-off current ratings of these other power semiconductor devices also.

SUMMARY OF THE INVENTION

Accordingly, it is an object of the present invention to provide multicellular power semiconductor devices with increased turn-off current ratings.

A further object of the invention is to provide power semiconductor devices less liable to malfunction due to loss of gate control.

A still further object of the invention is to provide power semiconductor devices of increased turn-off current ratings that can be fabricated with conventional semiconductor fabrication technology.

The foregoing and further objects of the invention are realized, in preferred form, in a power semiconductor device comprising a voltage-supporting layer; a main-current conductive, upper device layer, overlying the voltage-supporting layer and of multicellular construction; and a lower device layer, underlying the voltage-supporting layer.

The upper device layer includes an interior portion, and a peripheral portion, extending beyond the interior portion by more than about two on-state diffusion lengths of majority carriers in the voltage-supporting region. The upper and lower device layers are constructed to limit the on-state current density in the peripheral portion to no more than about 125 percent of the average on-state current density in the interior portion at the d.c. current rating of the device. As a result, an increase in the maximum on-state current that can be safely turned off is achieved in the subject power semiconductor device.

A variety of techniques are disclosed for limiting the on-state current density of the peripheral portion.

BRIEF DESCRIPTION OF THE DRAWINGS

While the specification concludes with claims defining the features of the invention regarded as novel, the invention itself, as to both organization and method of operation, will be better understood from the following description, in conjunction with the drawing figures, in which:

FIG. 1 is a cross-sectional view of a MOSTOT that can benefit from the present invention;

FIG. 3 is a schematic view in cross-section of a MOSTOT incorporating features of the present invention;

FIG. 4 is a tridimensional view, in cross-section, illustrating a MOSTOT incorporating features of the present invention;

FIG. 5 depicts, in contracted size relative to FIG. 4, a plan view of a cell arrangement pattern that may advantageously be incorporated in the MOSTOT of FIG. 4; and FIGS. 6, 7, and 8 depict, respectively, an insulated-gate transistor (IGT), a gate turn-off thyristor (GTO), and a bipolar transistor that may benefit from the present invention.

DESCRIPTION OF THE PREFERRED EMBODIMENTS

Figure 2A:
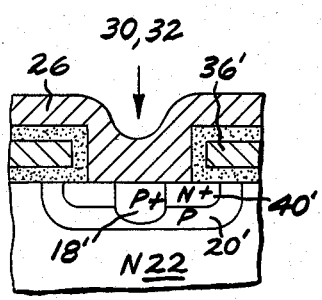
FIG. 2A is a detail view of an unaltered portion of the MOSTOT of FIG. 1, and FIGS. 2B, 2C, and 2D are detail views, respectively, of portions of alternative structures that may be utilized in the MOSTOT of FIG. 1 to achieve the purposes of the present invention.

FIG. 1 illustrates a MOSTOT 10 that can benefit from the present invention. MOSTOT 10 includes a voltage-supporting layer 12, an upper device layer 14 overlying voltage-supporting layer 12, and a lower device layer 16 underlying voltage-supporting layer 12. Upper device layer 14 is conductive to main current of device 10 and comprises an interior portion 14A, and a peripheral portion 14B, surrounding peripheral portion 14A and extending beyond portion 14A (i.e., to the left in FIG. 1) about two on-state diffusion lengths of hole current carriers (i.e., majority carriers) of P− (or high resistivity, P-conductivity type) voltage-supporting layer 12. Immediately to the left of peripheral portion 14B, as viewed in FIG. 1, is device termination region 17, which extends to the left-hand edge (not shown) of MOSTOT 10.

MOSTOT 10 contains a P-N-P-N thyristor structure, comprising a P+ (or low resistivity, P-conductivity type) emitter layer 18, together with adjoining P emitter layer 20; N base region 22; P− voltage-supporting, or base, layer 12; and N+ emitter layer 24. Upper and lower emitter electrodes 26 and 28, respectively, adjoin upper 18 and lower 24 emitter regions.

Device layer 14 comprises multiple cells, of which cells 30, 32 and 34 are illustrated. These cells are typically substantially identical to each other and thus are provided with similar reference numerals. Cells 30, 32, and 34 are interconnected to each other through upper emitter electrode 26, which adjoins the respective P+ emitter regions 18 or 18' of these cells. Each cell 30, 32, and 34, as viewed from above in FIG. 1, may be square, circular, hexagonal, or elongated, by way of example.

Each of cells 30, 32, and 34 includes MOS turn-off structure that is effective to transport electrons from N base 22 to upper emitter electrode 26. In cell 34, for example, such turn-off structure includes turn-off gate electrode 36; insulating layer 38, beneath electrode 36; P emitter region 20 beneath insulating layer 32; and N+ turn-off region 40, interconnecting emitter electrode 26 and P emitter region 20. Upon biasing of turn-off gate electrode 36 with a sufficiently high positive voltage, an electron-conductive inversion channel (not shown) is formed in P emitter region 20, beneath the turn-off gate electrode; the channel completing a conductive path 41, for schematically-shown electrons, from N base region 22 to emitter electrode 26, via N+ turn-off region 40.

If peripheral portion cells 30 and 32 of device layer 14 are each identical to interior portion cell 34, then arrows 50, representing current intensity or magnitude, are more closely spaced beneath peripheral portion cells 30 and 32 than interior portion cell 34. In this situation, the current density of peripheral cells 30 and 32 is typically two or three times higher than the current density of interior cell 34, at least for device operation at the device direct current (d.c.) current rating (i.e., a standard, maximum current rating under d.c. conditions). This is due to the tendency of current to "spread" into left-hand portion 12' of voltage-supporting layer 12 owing to the lower resistance path provided by portion 12'.

While the higher on-state current density in peripheral cells 30 and 32 contributes toward an enhanced on-state current density in MOSTOT 10, the disparity in current density between peripheral cells 30 and 32 and interior cell 34 detrimentally affects the turn-off capacity of MOSTOT 10. Specifically, peripheral cells 30 and 32 are each required to turn off more on-state current than each interior cell 34, although the turn-off capability of each cell is typically the same. In the dynamic turn-off process of MOSTOT 10, therefore, interior cell 34 turns off prior to peripheral cells 30 and 32, and device current then diverts to the peripheral cells, since at that time these cells present a lower resistance path between emitter electrodes 26 and 28. The turn-off demands on peripheral cells 30 and 32 are consequently increased. The turn-off capacity of peripheral cells 30 and 32 may well be exceeded for a specified level of aggregate device current, whereby MOSTOT 10 will either need to be derated in turn-off capacity, or will fail to turn off under gate control.

A preferred solution to the foregoing problem of current density disparity as between peripheral cells 30, 32 and interior cell 34 is to reduce, either partially or wholly, the capacity of the peripheral cells to conduct on-state device current between peripheral portions of emitter electrodes 26 and 28. Such reduction in "main electrode" current conduction capacity (as opposed to current conduction due to current spreading from adjacent interior cells) is suitably implemented to such a degree that the current density of peripheral cells 30 and 32 is no higher than about 125 percent of the average on-state current density of interior cell 34 at the d.c. current level of MOSTOT 10; preferably such factor is about 100 percent or less. This may be accomplished by decreasing the transport factor of N base layer 22 in peripheral portion 14B of layer 14, or by decreasing the injection efficiency of P+ emitter regions 18' in peripheral cells 30 and 32, or both. Suitable techniques for reducing either or both of the foregoing parameters (i.e., transport factor and emitter efficiency) are described and claimed in the above-cited copending U.S. patent application Ser. No. 640,280, now U.S. Pat. No. 4,620,211.

Figure 2B:
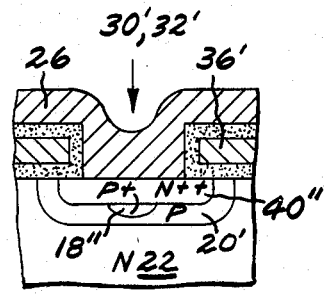
Figure 2C:
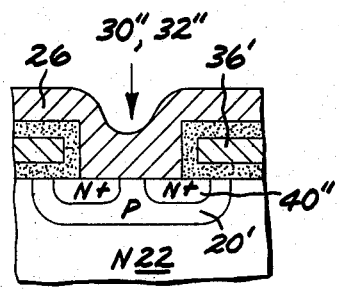
Figure 2D:
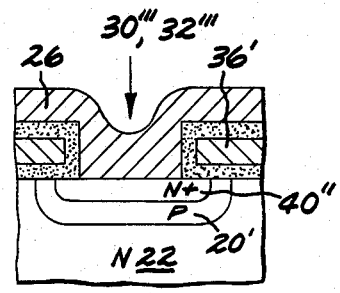

Further techniques of reducing the on-state current density in peripheral cells 30 and 32 of MOSTOT 10 are illustrated in the modifications of the peripheral cells that are depicted in FIGS. 2B, 2C, and 2D. FIG. 2A, a detail view of MOSTOT 10 of FIG. 1, is also shown for ease of appreciating FIGS. 2B, 2C, and 2D.

A first preferred modification of peripheral cells 30, 32 is illustrated in FIG. 2B as cells 30', 32', in which P+ emitter region 18" is electrically isolated from emitter electrode 26, whereby modified cells 30' and 32' are rendered incapable of conducting main electrode on-state device current. This is achieved in cells 30' and 32' by making turn-off region 40" very heavily doped, i.e., doped to N++, at a doping concentration of about $10^{20}$ dopant atoms per cubic centimeter, for example. The higher concentration of N-conductivity type impurities in N++ turn-off region 40" overcomes (i.e., converts to N-conductivity type) a lesser concentration of P-conductivity type impurities of P+ emitter region 18", so that only a lower portion of P+ emitter region 18" is provided, the lower portion being electrically isolated from emitter electrode 26 by N++ region 40".

With peripheral cells 30' and 32' unable to carry main electrode on-state current, the density of on-state current in cells 30 and 32 is considerably reduced in extent and is suitably no higher than about 125 percent of the current density in interior cell 34 (FIG. 1) at the d.c. current rating of the device; such factor preferably being about 100 percent or less. Modified peripheral cells 30' and 32' are, accordingly, able to contribute towards turn-off of MOSTOT 10 without being overloaded in their turn-off function.

FIG. 2C illustrates a further arrangement for peripheral cells 30", 32", in which no P+ emitter region (such as region 18 in FIG. 2A) is included. Main current on-state current in cells 30", 32" is reduced, but not eliminated, since P emitter region 20' injects current carriers into N base region 22, although at a lesser rate than would a more highly doped, P+ emitter region.

With the on-state current density in peripheral cells 30", 32" preferably being no higher than about 125 percent (and preferably, 100 percent) of the current density of interior cell 34 (FIG. 1) at the d.c. current rating of the device, the turn-off function of the peripheral cells does not become overloaded.

FIG. 2D illustrates a further arrangement for peripheral cells 30, '''32''', in which there is no P+ emitter region, such as region 18' in cells 30,32 (FIG. 2A). Cells 30,'''32''' thus cannot conduct main electrode on-state current, since there is no conductive connection between P emitter region 20' and emitter electrode 26. Cells 30,'''32''' still contribute toward turn-off of MOSTOT 10, however, in a manner similar to that described for cells 30,32 in FIG. 1.

A further technique of partially reducing on-state current density in peripheral cells 30 and 32 may be implemented as illustrated in MOSTOT 10' of FIG. 3. Except for an alternative, lower device layer 16, MOSTOT 10' is substantially identical to MOSTOT 10 shown in FIG. 1.

Lower device layer 16' includes a P region 52, and N+ emitter regions 54, spaced from each other. In MOSTOT 10', voltage-supporting layer 12 is electrically shorted to lower emitter electrode 28 at emitter short location 56 and at interior emitter short locations 58, via P layer 52. The presence of lower emitter electrode shorts 56 and 58 renders MOSTOT 10 asymmetric in regard to current blocking states. That is, while MOSTOT 10' can block current in the forward direction, due to the inclusion of forward blocking P-N junction 60 (between layers 22 and 12), P-N junction 62 (between layers 52 and 54) cannot function as a reverse-blocking junctions, due to emitter shorts 56 and 58 being in electrical parallel with junction 62.

To reduce the on-state current density in peripheral cells 30 and 32, peripheral portion emitter short 58 has a higher shorting density than interior portion emitter short 56; "shorting density" signifying herein the effective surface area of P− voltage-supporting region 12 electrically shorted to lower emitter electrode 28, per unit device area. While peripheral emitter short 58 is illustrated as having a density of unity since no N+ regions 54 are located in peripheral portion 14B, it could alternatively have a lower density, preferably by having narrow N+ emitter regions 54 laterally interspersed in the peripheral portion of P layer 52.

Illustrated in FIG. 4 is a further MOSTOT 410 incorporating features of the present invention. MOSTOT 410 is similar to MOSTOT 10 of FIG. 1, and, accordingly, has reference numerals similar to those of MOSTOT 10 for corresponding parts (except for being incremented by 400). FIG. 4 depicts various cross-sectional faces of MOSTOT 410, and, in particular, depicts elongated cells 450 and 452; the foreground end of cell 450 being illustrated, while cell 452 is shown recessed for ease of description.

Reduction in the on-state current density of the peripheral portions of cells 450 and 452 is achieved by contacting upper emitter electrode 426 to interior portion 414A of layer 414, but not to peripheral portion 414B of the cells. This can advantageously be accomplished without the use of an additional photolithographic masking step, by modifying the inherently-required photolithographic masking step to pattern emitter electrode 426 in accordance with the present invention. On-state current can still flow in the peripheral portions of cells 450 and 452, however, since emitter regions 418 are each connected to upper emitter electrode 426. However, portions of emitter regions 418 spaced from electrode 426 (such as the foreground ends of regions 418) conduct a reduced level of on-state current. This is due to a reduced injection efficiency of such emitter portions resulting from a resistive voltage drop along emitter regions 418. Such resistive voltage drop may be minimized by doping emitter regions 418 to a relatively high concentration, e.g., to $5 \times 10^{19}$ dopant atoms per cubic centimeter or more for a silicon device.

The peripheral portions of cells 450 and 452 are able to turn off current therein, due to the inclusion in these cells of $N^{30}$ turn-off regions 440 and associated turn-off gates 436. To assure an adequate level of turn-off capability in the periphery of cells 450 and 452, the doping concentration of N+ turn-off regions 440 should be relatively high to minimize the resistive voltage drop from the foreground peripheral edge of the cells to upper emitter electrode 426. By way of example, for a MOSTOT 10 of silicon, a suitable doping concentration is $5 \times 10^{20}$ for N+ turn-off region 440, where P+ emitter regions 418 are doped to a concentration of $5 \times 10^{19}$ dopant atoms per cubic centimeter.

In order to leave the entire peripheral edge of MOSTOT 410 uncovered by upper emitter electrode 426, a suitable cell configuration 500 is schematically illustrated, in contracted form relative to FIG. 4, in FIG. 5. Cell configuration 500 can be coextensive, for example, with a mask (not shown) for the formation of P emitter regions 420 of MOSTOT 410 (FIG. 4). Cell configuration 500 comprises a plurality of elongated parallel regions, with the leftmost and rightmost regions, as illustrated, including protruding portions 504 and 506, respectively, oriented orthogonally to elongated portions 502. Dashed-line square 508 represents the area on which an upper emitter electrode is to be confined, in accordance with the current-reduction technique illustrated in FIG. 4.

Figure 6:
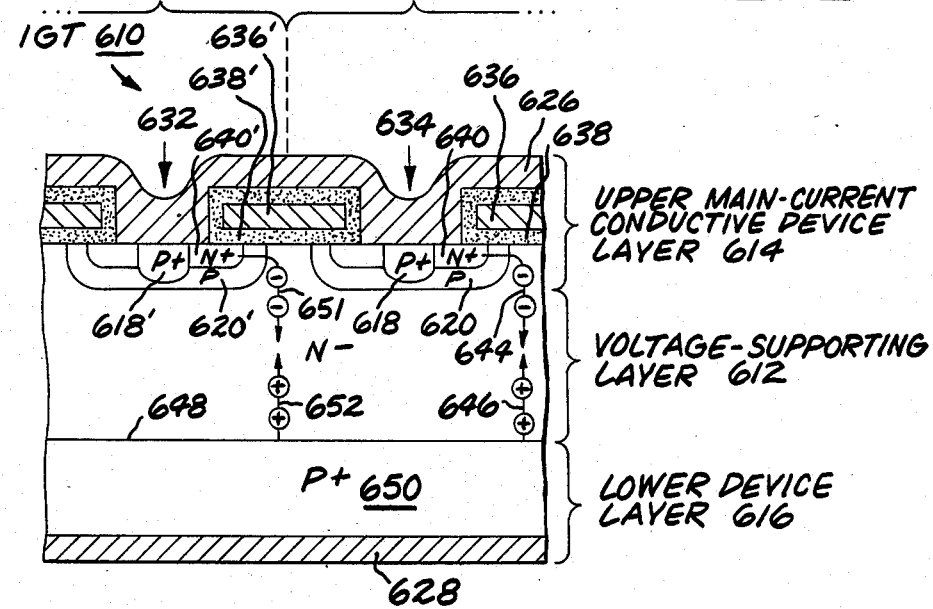

Techniques of the present invention are applicable to power semiconductor devices other than MOSTOTs, one example being an insulated-gate transistor (IGT) 610, depicted in FIG. 6. IGT 610 is structurally similar to MOSTOT 10 (FIG. 1) in various particulars; accordingly, portions of IGT 610 and corresponding portions of MOSTOT 10 have similar reference numerals (the numerals for IGT 610 being augmented by 600). A P+ region 650 is included in lower device layer 616 of MOSTOT 610, and adjoins voltage-supporting layer 612.

IGT 610 conducts on-state current between upper and lower main electrodes 626 and 628, respectively, upon suitable biasing of interconnected gate electrodes 636 and 636'. With a sufficiently high positive biasing voltage on gate electrodes 636, 636'; respective electron-conductive inversion layers (not shown) are induced in P regions 620, 620', beneath the gate electrodes. Such inversion layers electrically interconnect upper main electrode 626 to N− voltage-supporting layer 612, via N+ region 640. Accordingly, in cell 634, schematically-depicted electron current 644 flows downwardly in IGT into voltage-supporting layer 612, during on-state conduction. Simultaneously, schematically-depicted hole current 646 is injected upwardly in voltage-supporting layer 612, from P+ layer 650, when P-N junction 648 (between layers 650 and 612) is forward-biased above its inherent potential. The recombination of electrons 644 and holes 646 in voltage-supporting layer 612 is the phenomenon responsible for on-state current in IGT 610. Further details of IGT structure and operation may be found, for example, in B. J. Baliga, "The Insulated Gate Rectifier (IGR): A New Power Switching Device", IEDM 82, (December 1982), pages 264–267, the entirety of which is incorporated herein by reference.

IGT 610 latches on in thyristor fashion, with loss of gate control, if the on-state current density in any of its cells exceeds a threshold latching level. To assure that IGT 610 retains its gate control capacity to a maximum on-state current level, the on-state current density in peripheral cell 632 is reduced, preferably so as to be no higher than the on-state current density of interior cell 634. Current density reduction in cell 632 may be accomplished through use of any of the above-described current reduction techniques.

Additional current density-reduction techniques, especially suited for IGTs, involve the increase of gate threshold voltage in peripheral cells of an IGT. In IGT 610 (FIG. 6), this would result in a lower level of peripheral electron current 651 relative to interior electron current 644. The corresponding peripheral hole current 652 decreases as well, so that peripheral cell current density is lowered. One technique of increasing the peripheral gate threshold voltage is to increase the thickness of peripheral insulating layer 638' beneath gate electrode 636' relative to the thickness of interior insulating layer 638 beneath gate electrode 636. (In this situation, the dividing line between peripheral and interior cells can be considered to pass vertically through P+ emitter region 618, rather than vertically through gate electrode 636' as illustrated.) An increase in thickness of insulating layer 638' of at least about 50 percent, and, more preferably, by a factor of 2 to 3, is typical. A further technique for increasing the peripheral gate threshold voltage in an IGT is to increase the doping concentration of peripheral P base regions 620' relative to interior P base region 620. An increase in doping concentration of at least about 50 percent, and, more preferably, by a factor of about 2 or more, is typical. In addition to increasing the peripheral gate threshold voltage, the present technique also raises the IGT latching threshold current in the peripheral IGT cells due to the lower resistance resulting from more highly doped P base regions.

Gate Turn-Off Thyristors (GTOs), such as GTO 710 depicted in FIG. 7, benefit from the use of any of the above-described techniques for reducing on-state current density in a peripheral portion of a power semiconductor device. In FIG. 7, parts of GTO 710 similar to parts of MOSTOT 10 (FIG. 1) have correspondingly similar reference numerals (the numerals for GTO 710 simply being augmented by 700 relative to the numerals for MOSTOT 10).

GTO 710 is operated in the following manner. Electron current (not shown) is supplied to base region 22, via gate electrode 742, at a sufficient level to turn on GTO 710, the required level of electron current being readily determinable to those in the art. Turn-off of GTO 710 involves a reversal of the turn-on procedure; that is, electron current is removed from N base region 22, via gate electrode 742, at a sufficient level to achieve device turn-off, the required level of electron current being readily determinable to those skilled in the art.

By utilizing any of the above-described current density-reduction techniques for peripheral cells in cell 732 of GTO 710, peripheral gate 742' will not become overloaded with current diverted from previously turned-off interior cell 734. Rather, both peripheral cell 732 and interior cell 734 turn off simultaneously. By way of example, the injection efficiency of P emitter region 718' of peripheral cell 732 can be reduced by doping region 718' to a lesser doping concentration than P+ emitter region 718 of interior cell 734. A typical doping concentration for a P emitter region 718', for a silicon GTO 710, is $700 \times 10^{19}$ dopant atoms per cubic centimeter, while a typical doping concentration for P+ emitter region 718 is $10^{20}$ dopant atoms per cubic centimeter.

FIG. 8 illustrates a bipolar transistor 810 that may benefit from the present invention. Portions of transistor 810 that are similar to respective portions of MOSTOT 10 (FIG. 1) are assigned correspondingly similar reference numerals (the reference numerals for bipolar transistor 810 being augmented by 800, however). Bipolar transistor 810 includes an N+ layer 850, and a voltage-supporting layer 812 overlying layer 850. Layers 812 and 850 constitute the collector portion of transistor 810.

Operation of bipolar transistor 810 is as follows. Turn-on of transistor 810 commences with the supply of a sufficient level of base current to base region 820, through interconnected base electrodes 830 and 830'; the required level of current being readily determinable by those skilled in the art. Turn-off of transistor 810 commences with the termination, or, if desired, the reversal of base drive current by gate electrodes 830 and 830'. The turn-off current rating of bipolar transistor 810 is determined by the maximum on-state current that can be turned off without device malfunction (for example, a destructive, so-called "second breakdown" malfunction).

If peripheral cell 832 is identical in structure to interior cell 834, the on-state current density of the peripheral cell will exceed that of the interior cell, due to current spreading in N− collector region 812. The turn-off current rating of bipolar transistor 810 in this case is lower than can be attained if the on-state current density in peripheral cell 832 is reduced in accordance with the present invention. Transistor 810 remains on until peripheral cell 832 turns off, and, during this delay, is effectively without gate control. The on-state current density in peripheral cell 832 can be reduced through use of any of the various on-state current density reduction techniques described herein, except for the FIG. 3 emitter electrode shorting technique. For example, the doping concentration of N+ emitter region 840' of peripheral cell 832 can be lower than that of N+ emitter region 840 of interior cell 834. For instance, in a silicon bipolar transistor 810, the dopant concentration of impurity atoms per cubic centimeter for N+ emitter region 840' may be $10^{19}$, and for N+ emitter region 834, $10^{20}$, to achieve a current reduction in peripheral cell 832. Alternatively, the doping concentration in the peripheral portion of P base region 820 may be increased relative to the doping concentration in the interior portion. This reduces the injection efficiency of N+ emitter region 840' in peripheral cell 832, and, also, reduces the base transport factor in the peripheral portion of base region 820.

The foregoing describes power semiconductor devices with increased turn-off current ratings, and a reduced likelihood of malfunction due to loss of gate control. The devices additionally achieve increased current-conduction capacity, due to the current uniformity achieved by the present invention. The various described techniques of providing devices with the foregoing features may be performed using conventional semiconductor device fabrication technology.

While the invention has been described with respect to specific embodiments by way of illustration, many modifications and changes will occur to those skilled in the art. For example, different ones of the presently-described techniques of peripheral cell current density reduction can be combined, except for the above-noted exception of anode-shorting (i.e., FIG. 3) which cannot be used in a bipolar transistor. Additionally, semiconductor devices complementary in conductivity types to the presently-described semiconductor devices could be provided, in which P-conductivity type material is substituted for N-conductivity type material, and vice versa. It is, therefore, to be understood that the appended claims are intended to cover all such modifications and changes as fall within the true spirit and scope of the invention.

What is claimed as the invention and desired to be secured by Letters Patent of the United States is:

1. In a gate turn-off semiconductor device including a voltage-supporting layer, an upper device layer overlying said voltage-supporting layer, a lower device layer underlying said voltage supporting layer, a multiplicity of main device current conducting cells formed in said upper layer and a common gate structure for turning off the flow of main device current in said cells; the improvement wherein:

said upper device layer is formed having an interior portion containing a first plurality of said cells, a termination region laterally surrounding said interior portion, and a peripheral portion intermediate said interior portion and said termination region, said peripheral portion containing a second plurality of said cells and having a lateral width in excess of approximately two on-state diffusion lengths of majority carriers in said voltage-supporting layer, and at least one of said upper and lower device layers being structured to limit the main device current density in said perpheral portion to no more than 125 percent of the average main current density in said interior portion, thereby enabling the portion of said gate structure associated with said second plurality of cells to effectively contribute to reliable turn-off of the main device current.

2. The gate turn-off semiconductor device defined in claim 1, which further includes an upper main current electrode overlying said upper device layer, said upper main current electrode electrically contacting a selected region of each said cell of said first plurality and electrically isolated from said cells of said second plurality.

3. The gate turn-off semiconductor device defined in claim 1, which further includes an upper main current electrode overlying said upper device layer and in electrical contact with a selected region of each said cell of said first plurality, said upper main current electrode terminating short of said peripheral portion of said upper device layer.

4. The gate turn-off semiconductor device defined in claim 1, wherein said device is a thyristor which further includes a lower main current electrode electrically contacting said lower device layer, said lower device layer and said voltage-supporting layer being of one conductivity type, and said lower device layer including at least one region of opposite conductivity type arranged such that a greater percentage of the surface area of a first portion of said lower main current electrode underlying said upper device layer interior portion electrically contacts said opposite conductivity type region and a greater percentage of the surface area of a second portion of said lower main current electrode underlying said upper device layer peripheral portion electrically contacts said one conductivity type lower device layer.

5. The gate turn-off semiconductor device defined in claim 1, wherein said device is a thyristor and said gate structure is MOS-type gate structure, each said cell including a turn-off region formed in said upper device layer, said gate structure and said turn-off regions removing majority carriers from said voltage-supporting layer to turn off the main device current.

6. The gate turn-off semiconductor device defined in claim 1, wherein said device is a thyristor, said lower device layer is of opposite conductivity type to said voltage supporting layer, and at least each each said cell of said first plurality includes MOS-type current conduction means for supplying majority current carriers to said voltage-supporting layer under the control of said gate structure.

7. The gate turn-off semiconductor device defined in claim 6, wherein said gate structure is differentially formed such as to establish a greater gate threshold voltage for said cells of said second plurality formed in said upper device layer peripheral portion than for said cells of said first plurality formed in said upper device layer interior portion.

8. The gate turn-off semiconductor device defined in claim 6, wherein said MOS-type current conduction means is included in said cells of both said first and second pluralities, each said cell including a base region insulatively overlain by said common gate structure, said base regions in said cells of said second plurality having a doping concentration at least twice the doping concentration of said base regions in said cells of said first plurality.

9. The gate turn-off semiconductor device defined in claim 1, wherein said device is a thyristor, each said cell including a base region formed in said upper device layer, and said common gate structure electrically contacting said base region of each said cell and effective in removing majority current carriers therefrom to achieve turn-off of the main device current.

10. The gate turn-off semiconductor device defined in claim 1, wherein said device is a bipolar transistor, each said cell including a base region formed in said upper device layer, and said common gate structure electrically contacting said base region of each said cell.

11. The gate turn-off semiconductor device of claim 1, wherein each of said cells includes an emitter region ad a turn-off region, said upper main current electrode overlying each of said cells and electrically contacting said emitter and turn-off regions of said cells of said first plurality and electrically isolated from said emitter regions of said cells of said second plurality by said turn-off regions of said cells of said second plurality.

12. The gate turn-off semiconductor device of claim 11 wherein each of said cells further includes a base region in which said emitter and turn-off regions of each of said cells are formed, said base region being separated from said upper main current electrode by said emitter and turn-off regions.

13. The gate turn-off semiconductor device of claim 12, wherein said voltage supporting layer is of one type conductivity, said base region is of an opposite type conductivity, said emitter is of one type conductivity, said turn-off region is of opposite type conductivity and said lower device layer is of opposite type conductivity.

14. The gate turn-off semiconductor device of claim 13, wherein said cell base and emitter regions interface each other in a base-emitter junction, said common gate structure includes an insulated gate electrode overlying said base-emitter junction and said base, emitter and turn-off regions of each of said cells, said common gate structures, in response to appropriately applied bias voltages, inducing an opposite conductivity type channel through each said emitter region for turning said device on and for maintaining the voltage drop across each said base emitter junction at less than the forward bias potential of said junctions for turning said device off.

15. The gate turn-off semiconductor device of claim 14 wherein said emitter region of each of said cells includes a more heavily doped potion of said one type conductivity, each said more heavily doped emitter region portion of said cells of said first plurality being electrically contacted by said upper main current electrode, and said more heavily doped emitter region portions of said cells of said second plurality being electrically isolated and physically separated from said upper main current electrode by said turn-off regions.

16. The gate turn-off semiconductor device of claim 1 wherein said voltage supporting layer is of opposite type conductivity, said lower device layer is of opposite type conductivity, and said upper device layer includes a base region of one type conductivity in which are formed a plurality of emitter regions of opposite type conductivity, said common gate structure overlying said base region, said base region including an interior base portion for said first plurality of said cells and a peripheral base portion for said second plurality of cells, wherein the doping concentration of said peripheral base portion is at least 1.5 times the doping concentration of said interior base portion.

17. The gate turn-off semiconductor of claim 16 wherein the doping concentration of said peripheral base portion is at least two times the doping concentration of said interior base portion.

18. A gate turn-off semiconductor device conprising a voltage supporting layer of opposite type conductivity, a lower device layer of one type conductivity, an upper device layer, and a multiplicity of main device current conducting cells formed in said upper device layer, each said cell including a base region of one type conductivity in which is formed a turn-off region of opposite type conductivity, said upper device layer is formed having an interior portion containing a first plurality of said cells, a termination region laterally surrounding said interior portion, and a peripheral portion intermediate said interior portion and said termination region, said peripheral portion containing a second plurality of said cells, and an upper main current electrode overlying said upper device layer, an insulated gate structure overlying said base region, said insulated gate structure, when appropriately voltage biased, inducing channels in said cell base regions beneath said insulated gate electrode, said channels conductively coupling opposite type conductivity carriers from said upper main current electrode to said voltage supporting layer during gate induced forward conduction of main device current in said semiconductor device and, in response to removal or reversal of said bias on said insulated gate structure, repressing said channel to render said device non-conductive of main device current, said insulated gate structure including an insulating layer overlying said base regions and said turn-off regions of said cells, an interior portion of said insulating layer overlying said first plurality of said cells having a thickness $T_1$, and a peripheral portion of said insulating layer overlying said second plurality of said cells having a thickness $T_2$, wherein $T_2$ is at least 1.5 $T_1$.

19. The gate turn off semiconductor device of claim 18 wherein $T_2$ is at least 2 $T_1$.

20. The gate turn off semiconductor device of claim 19 wherein $T_2$ is at least 3 $T_1$.

* * * * *